(12) United States Patent
Imai et al.

(10) Patent No.: US 11,342,155 B2
(45) Date of Patent: May 24, 2022

(54) CHARGED PARTICLE BEAM DEVICE AND METHOD FOR ADJUSTING POSITION OF DETECTOR OF CHARGED PARTICLE BEAM DEVICE

(71) Applicant: Hitachi High-Tech Corporation, Tokyo (JP)

(72) Inventors: Yuta Imai, Tokyo (JP); Masahiro Sasajima, Tokyo (JP); Yoshihiro Takahoko, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/056,285

(22) PCT Filed: May 22, 2018

(86) PCT No.: PCT/JP2018/019569
§ 371 (c)(1),
(2) Date: Nov. 17, 2020

(87) PCT Pub. No.: WO2019/224896
PCT Pub. Date: Nov. 28, 2019

(65) Prior Publication Data
US 2021/0296081 A1    Sep. 23, 2021

(51) Int. Cl.
*H01J 37/145*    (2006.01)
*H01J 37/20*    (2006.01)
(Continued)

(52) U.S. Cl.
CPC .......... *H01J 37/145* (2013.01); *H01J 37/20* (2013.01); *H01J 37/244* (2013.01);
(Continued)

(58) Field of Classification Search
CPC ........ H01J 37/145; H01J 37/20; H01J 37/244; H01J 37/265; H01J 37/28;
(Continued)

(56) References Cited

U.S. PATENT DOCUMENTS 6,040,575 A * 3/2000 Whitehouse ........... B82Y 15/00
250/282
6,444,981 B1 * 9/2002 Todokoro ............... H01J 37/28
250/306

(Continued)

FOREIGN PATENT DOCUMENTS

JP      1-221848 A      9/1989
JP      7-65775 A       3/1995
WO      WO 2015/016040 A1  2/2015

OTHER PUBLICATIONS

International Search Report (PCT/ISA/210) issued in PCT Application No. PCT/JP2018/019569 dated Jul. 31, 2018 with English translation (two (2) pages).

(Continued)

*Primary Examiner* — David A Vanore
(74) *Attorney, Agent, or Firm* — Crowell & Moring LLP

(57) ABSTRACT

In a charged particle beam device including a deceleration optical system, a change in a deceleration electric field and an axis shift due to a structure between an objective lens and a sample are prevented to reduce adverse effects on an irradiation system and detection system. The charged particle beam device includes an electron source, an objective lens configured to focus a probe electron beam from the electron source on the sample, an acceleration electrode configured to accelerate the probe electron beam, a first detector provided in the acceleration electrode, a deceleration electrode configured to form a deceleration electric field for the probe electron beam with the acceleration electrode, the probe electron beam being configured to pass through an (Continued)

opening of the deceleration electrode, and a second detector inserted between the deceleration electrode and the sample. The second detector includes an opening portion larger than the opening of the deceleration electrode, and a sensing surface is provided around the opening portion.

14 Claims, 9 Drawing Sheets

(51) Int. Cl.
  *H01J 37/244* (2006.01)
  *H01J 37/26* (2006.01)
  *H01J 37/28* (2006.01)
(52) U.S. Cl.
  CPC ............ *H01J 37/265* (2013.01); *H01J 37/28* (2013.01); *H01J 2237/04756* (2013.01)
(58) Field of Classification Search
  CPC ... H01J 2237/04756; H01J 2237/24475; H01J 2237/1502
  See application file for complete search history.

(56) References Cited

U.S. PATENT DOCUMENTS

| | | | | |
|---|---|---|---|---|
| 10,541,103 | B2* | 1/2020 | Mizuhara | H01J 37/244 |
| 10,886,101 | B2* | 1/2021 | Hirano | H01J 37/153 |
| 11,139,144 | B2* | 10/2021 | Mizutani | H01J 37/28 |
| 2003/0127604 | A1* | 7/2003 | Todokoro | H01J 37/28 |
| | | | | 250/436 |
| 2014/0175279 | A1* | 6/2014 | Agemura | H01J 37/28 |
| | | | | 250/310 |
| 2016/0148782 | A1* | 5/2016 | Agemura | H01J 37/244 |
| | | | | 250/310 |
| 2016/0379795 | A1* | 12/2016 | Watanabe | H01J 37/21 |
| | | | | 250/310 |
| 2017/0271124 | A1* | 9/2017 | Sasaki | H01J 37/244 |
| 2019/0385810 | A1* | 12/2019 | Sato | H01J 37/244 |
| 2020/0273665 | A1* | 8/2020 | Morishita | H01J 37/05 |
| 2021/0035792 | A1* | 2/2021 | Vestal | H01J 49/06 |
| 2021/0296081 | A1* | 9/2021 | Imai | H01J 37/28 |

OTHER PUBLICATIONS

Japanese-language Written Opinion (PCT/ISA/237) issued in PCT Application No. PCT/JP2018/019569 dated Jul. 31, 2018 (three (3) pages).

* cited by examiner

[FIG. 1]
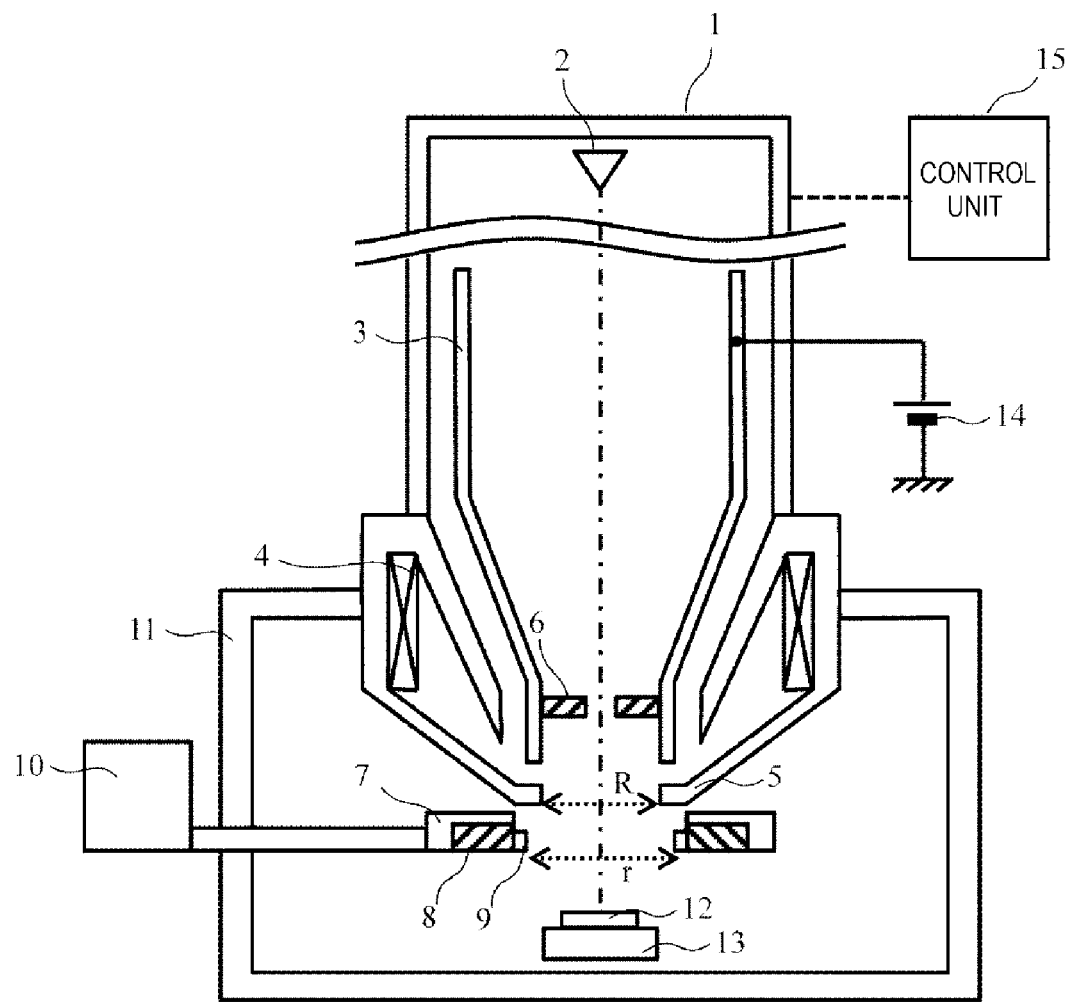

[FIG. 2]
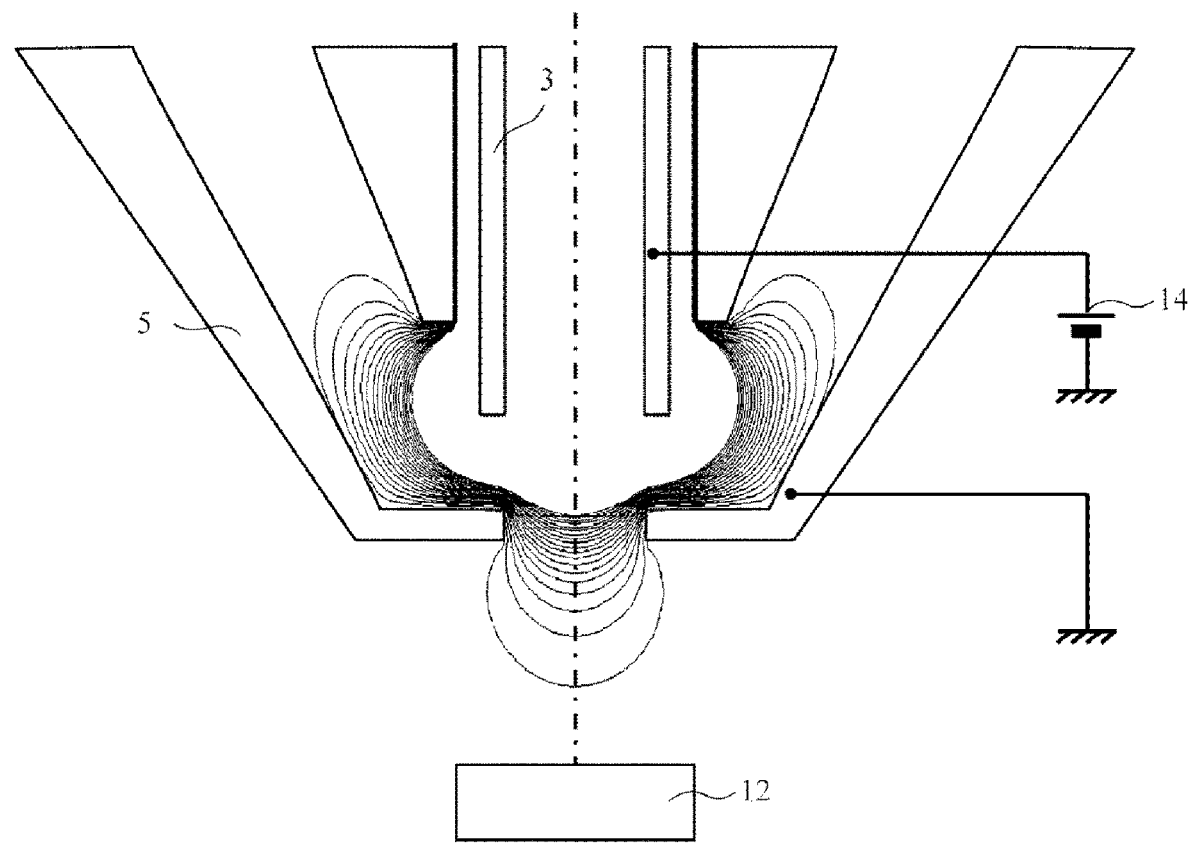

[FIG. 3]
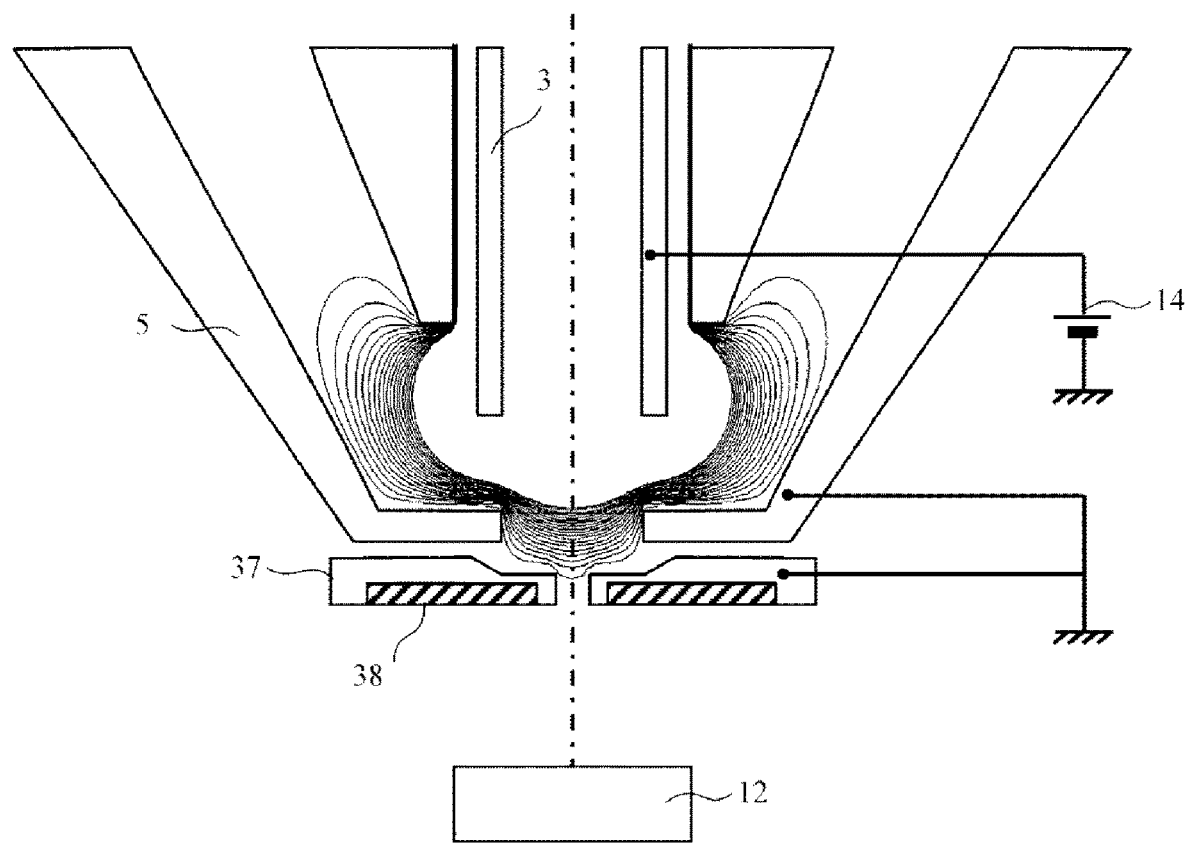

[FIG. 4]
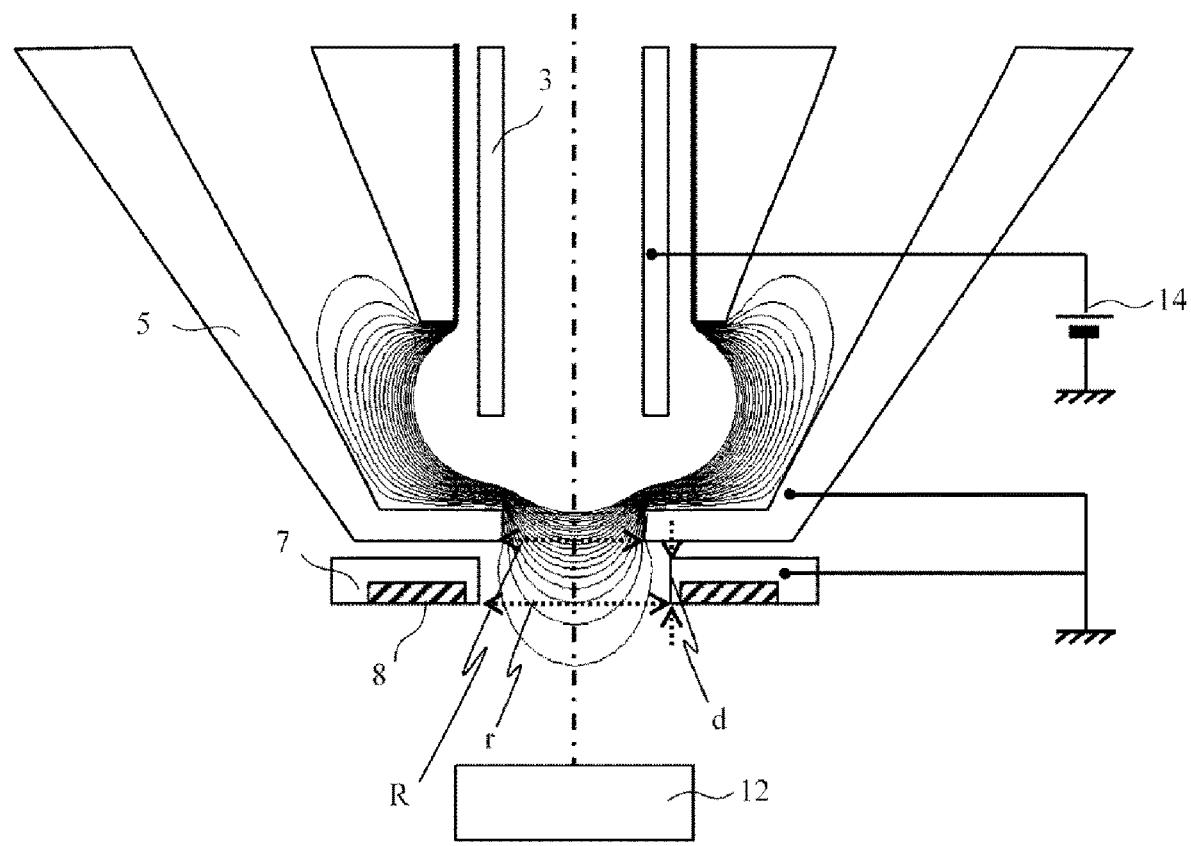

[FIG. 5]
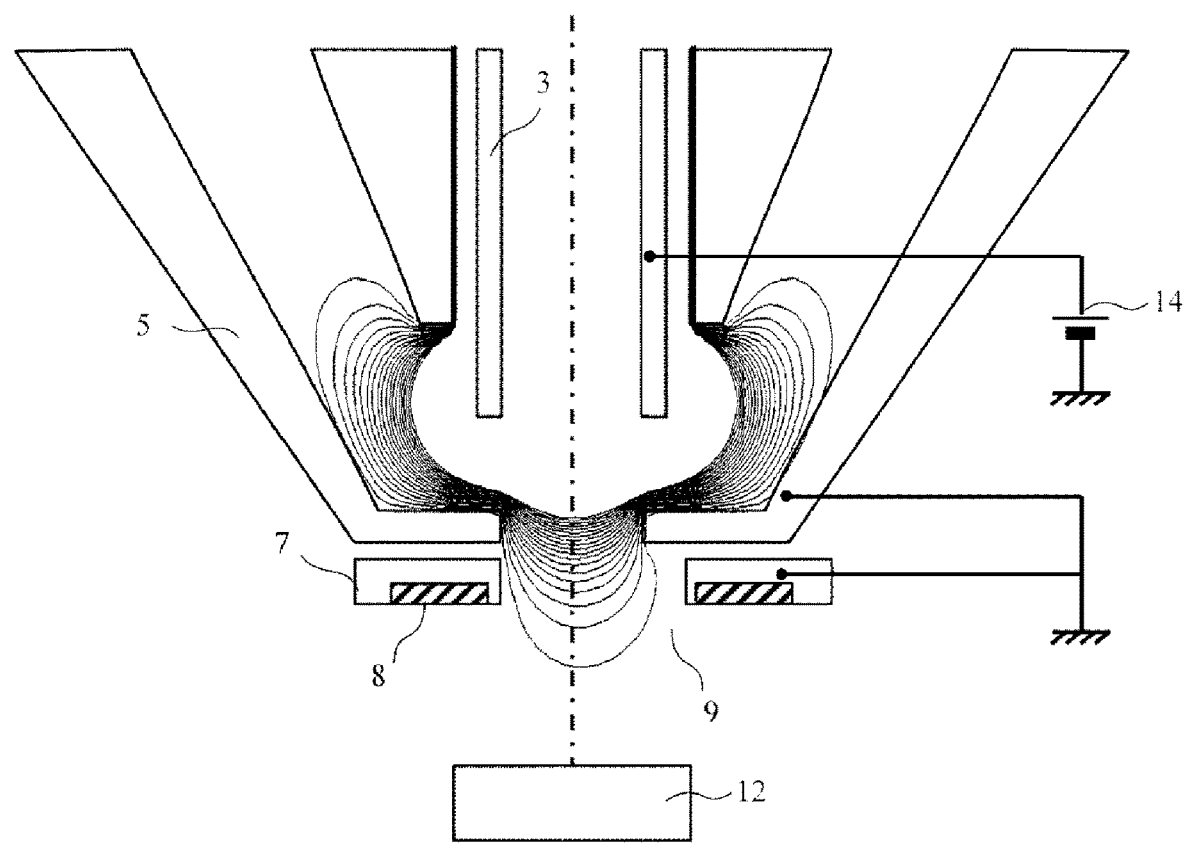
[FIG. 6]
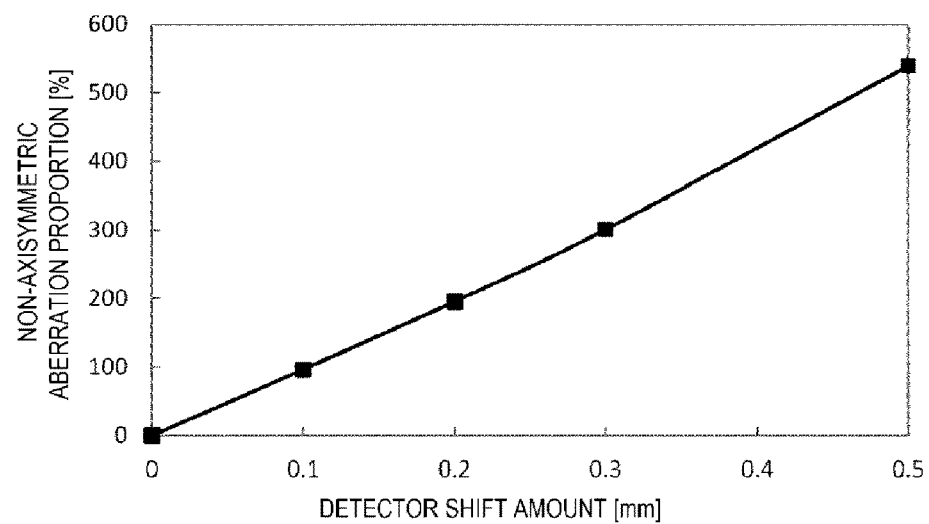

[FIG. 7]
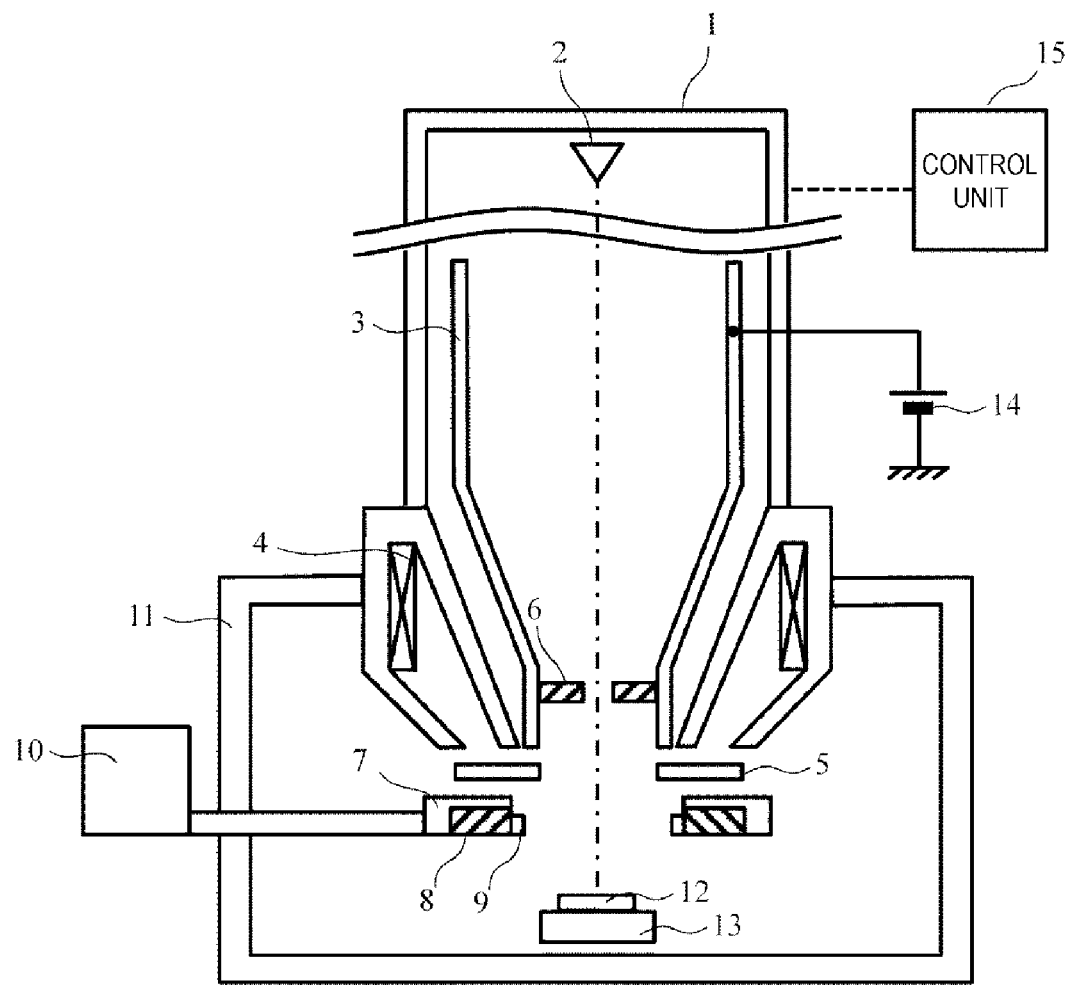

[FIG. 8]
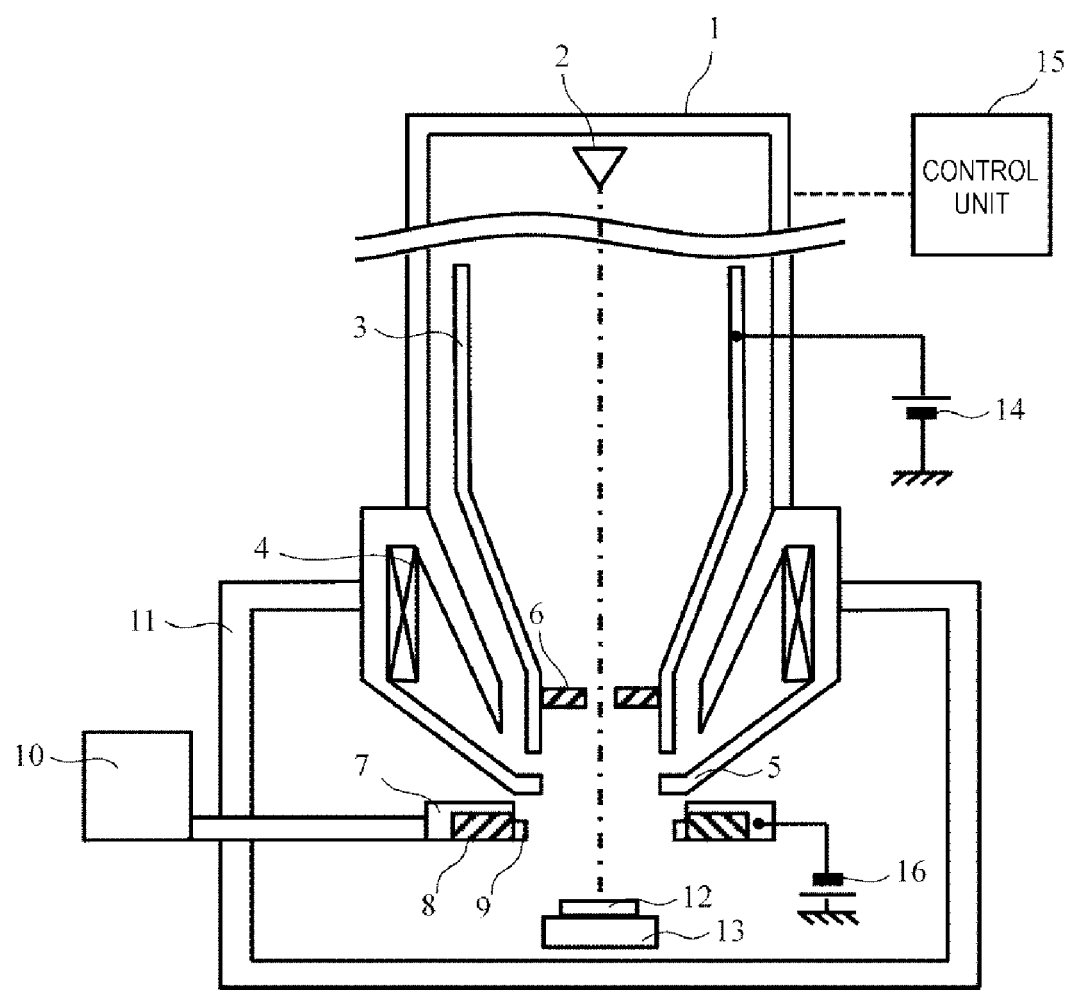

[FIG. 9]
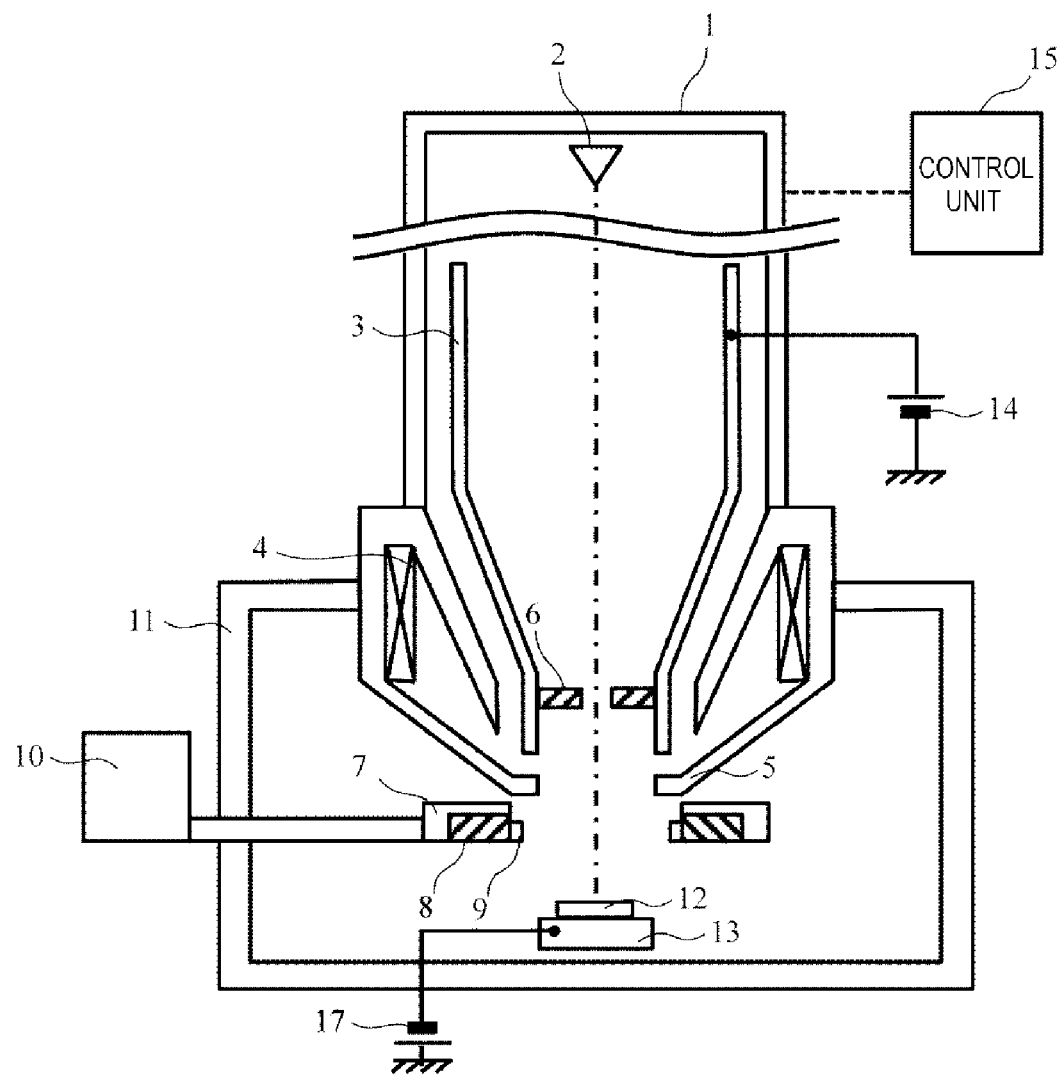

[FIG. 10]
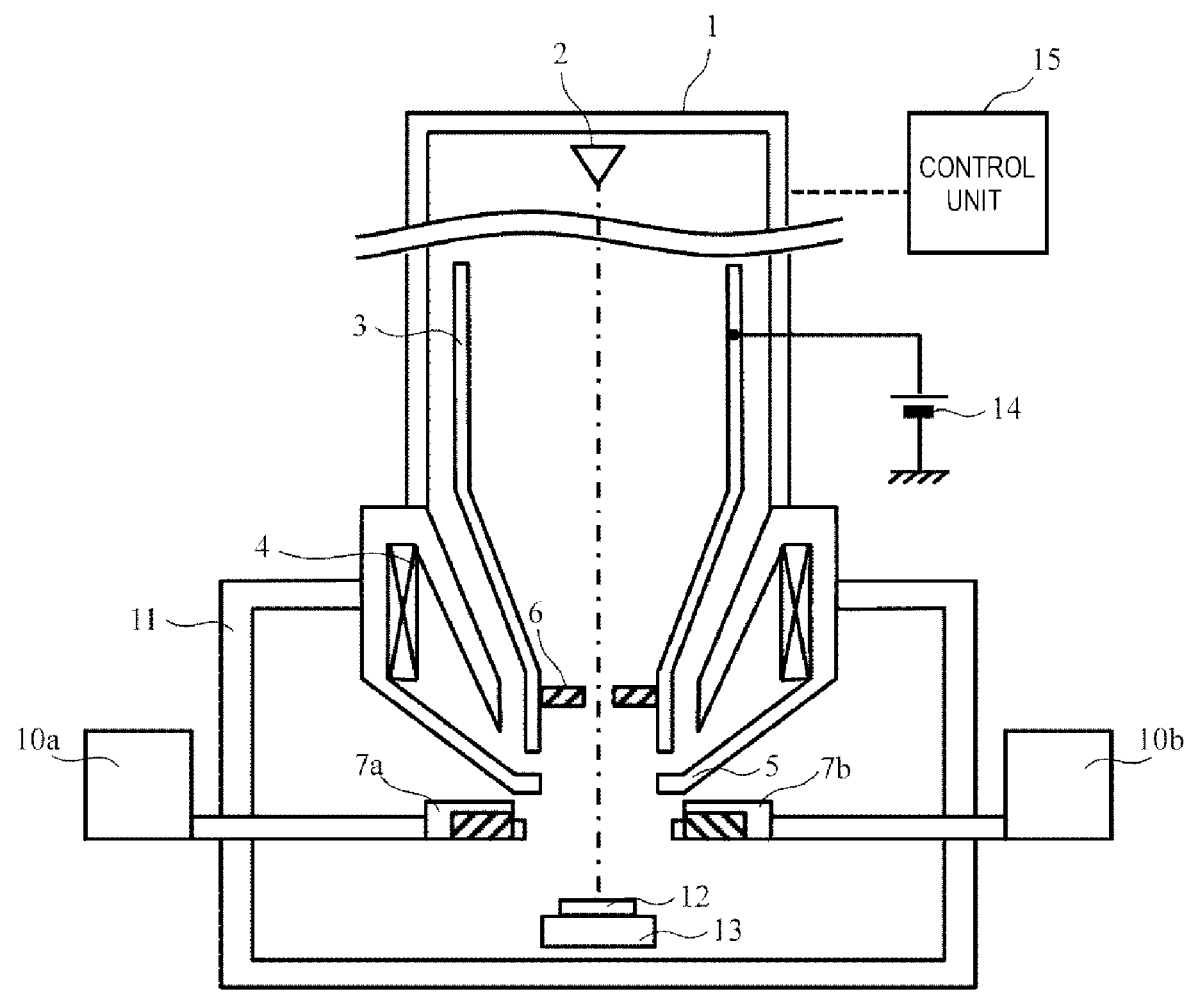

CHARGED PARTICLE BEAM DEVICE AND METHOD FOR ADJUSTING POSITION OF DETECTOR OF CHARGED PARTICLE BEAM DEVICE

TECHNICAL FIELD

The present invention relates to a charged particle beam device and a method for adjusting a position of a detector of the charged particle beam device.

BACKGROUND ART

A scanning electron microscope (SEM) obtains a two-dimensional image of a region to be scanned on a sample surface by detecting signal electrons generated when a sample is irradiated and scanned with a focused probe electron beam and displaying a signal intensity of each irradiation position in synchronization with a scanning signal of the irradiation electron beam.

In recent years, low acceleration observation with irradiation energy of about 1 keV or less is increasingly important for a purpose of avoiding charging or damage of the sample due to the electron beam irradiation during SEM observation and obtaining sample information on an electrode surface. However, chromatic aberration generally increases in a low acceleration region, and it is difficult to obtain high resolution. In order to reduce this chromatic aberration, there is a deceleration optical system in which a probe electron beam is accelerated to pass through an objective lens at a high speed, and is decelerated immediately before the sample to be emitted on the sample.

In a method called a boosting method in the deceleration optical system, a cylindrical electrode for applying a positive voltage is provided along an inner wall of an inner magnetic path of the objective lens of the SEM, and the sample is set to a ground voltage. Further, in a method called a retarding method, an objective lens side of an SEM column is kept at the ground voltage and a negative voltage is applied to the sample. Both methods are characterized in that a passage region of the probe electron beam from the objective lens to an electron source side has a higher voltage than the sample, and an electric field which is formed by a voltage difference and that decelerates the probe electron beam toward the sample is used as a lens field. By superposing an electrostatic lens caused by the deceleration electric field and a magnetic field lens caused by an objective lens magnetic field, the aberration can be reduced in the low acceleration region and a high resolution can be obtained.

On one hand, the signal electrons generated from the sample are accelerated and focused by an electric field between the sample and the objective lens and enter the SEM column. Therefore, efficient detection can be implemented by providing a detector inside the column. In particular, a structure in which the detector is provided in a high voltage space inside a boosting electrode is often used. PTL 1 discloses a configuration in which signal electrons are detected by a detection system disposed in a column in an SEM including such a deceleration optical system.

On the other hand, a method of detecting backscattered electrons (BSE) from a sample includes a method of providing a detector between a SEM column and the sample. A relatively large detection solid angle can be obtained by locating a detection surface in the vicinity of the sample, which is suitable for detecting the BSE scattered at a low angle on the sample. Accordingly, for example, a channeling contrast of the sample can be clearly observed. PTL 2 discloses a configuration in which an annular detector for BSE is provided between a column and a sample and an emission angle of BSE can be selected and detected.

CITATION LIST

Patent Literature

PTL 1: WO2015/016040
PTL 2: JP-A-7-65775

SUMMARY OF INVENTION

Technical Problem

In the SEM including the deceleration optical system, an electric field formed between a distal end of the SEM column and the sample plays an important role for an irradiation system and detection system. On the other hand, a structure having a detection surface is disposed between the SEM column and the sample to obtain a signal from the sample. The structure disposed between the column and the sample affects the electric field between the column and the sample. As a result, a probe electron beam trajectory and a signal electron trajectory change, which may lead to deterioration of a performance of the irradiation system and detection system.

For example, an electric field extending from an acceleration electrode in the objective lens to the sample through an opening of a deceleration electrode may be shielded by the structure under the objective lens. In this case, a main surface position of the electrostatic lens formed by the electric field is moved away from the sample, and thus the aberration of the entire objective lens increases and the resolution lowers. In addition, an effect of collecting the signal electrons in the objective lens is attenuated, and detection efficiency of the in-column detector lowers.

Further, when the structure under the objective lens lacks symmetry with respect to a central axis of the electric field formed by the acceleration electrode and the deceleration electrode, an axially asymmetric electric field is generated in the vicinity of the sample. At this time, a deflection action of the electric field causes a shift of an arrival position of the probe electron beam and an increase in off-axis aberration, which deteriorates the resolution and usability.

Solution to Problem

In order to solve the above technical problem, a configuration described in the claims is adopted. For example, a charged particle beam device of one embodiment includes an electron source, an objective lens configured to focus a probe electron beam from the electron source on the sample, an acceleration electrode configured to accelerate the probe electron beam, a first detector provided in the acceleration electrode, a deceleration electrode configured to form a deceleration electric field for the probe electron beam with the acceleration electrode, the probe electron beam being configured to pass through an opening of the deceleration electrode, and a second detector inserted between the deceleration electrode and the sample. The second detector includes an opening portion larger than the opening of the deceleration electrode, and a sensing surface is provided around the opening portion.

Advantageous Effect

In a charged particle beam device including a deceleration optical system, a change in a deceleration electric field and an axis shift due to a structure between an objective lens and a sample is prevented to reduce adverse effects on an irradiation system and detection system.

Other technical problems and novel characteristics will become apparent from a description of the description and the accompanying drawings.

BRIEF DESCRIPTION OF DRAWINGS

FIG. 1 is a schematic cross-sectional view showing a charged particle beam device according to an embodiment.

FIG. 2 is a diagram showing a voltage distribution in the vicinity of a sample in an SEM including a deceleration optical system.

FIG. 3 is a diagram showing a voltage distribution in the vicinity of a sample when an under-objective-lens detector is disposed according to a comparative example.

FIG. 4 is a diagram showing a voltage distribution in the vicinity of a sample when an under-objective-lens detector is disposed according to the present embodiment.

FIG. 5 is a diagram showing a voltage distribution in the vicinity of the sample when the under-objective-lens detector is disposed according to the present embodiment.

FIG. 6 is a diagram showing a change in non-axisymmetric aberration in association with a positional shift amount of the under-objective-lens detector.

FIG. 7 is a schematic cross-sectional view showing a modification of the charged particle beam device according to the present embodiment.

FIG. 8 is a schematic cross-sectional view showing a modification of the charged particle beam device according to the present embodiment.

FIG. 9 is a schematic cross-sectional view showing a modification of the charged particle beam device according to the present embodiment.

FIG. 10 is a schematic cross-sectional view showing a modification of the charged particle beam device according to the present embodiment.

DESCRIPTION OF EMBODIMENTS

Hereinafter, an embodiment of the invention will be described with reference to the accompanying drawings. Although the accompanying drawings show a specific embodiment in accordance with principles of the invention, the present embodiment is provided for a purpose of understanding the invention, and is not used for limiting interpretation of the invention. In all the drawings showing the present embodiment and modifications, those having the same function are designated by the same reference numerals, and the repeated description thereof will be omitted.

FIG. 1 is a schematic cross-sectional view showing a charged particle beam device according to the present embodiment. An SEM to which a boosting method is applied is shown as an example of the charged particle beam device. An SEM column 1 includes an electron source 2 including a mechanism that irradiates a sample 12 with a probe electron beam, an electronic lens such as a condenser lens (not shown) and an objective lens 4, a deflector (not shown) that scans the sample 12 with the probe electron beam, and a first detector 6 that detects signal electrons generated from the sample 12. The objective lens 4 generates a magnetic field using, for example, a coil, and forms a magnetic field lens that focuses the probe electron beam on the sample 12. The SEM column 1 may include other components (lens, electrode, detector, and the like) other than the above, and is not limited to the above-described configuration.

Further, the SEM includes a sample chamber 11. The sample chamber 11 is provided with a sample table 13 on which the sample 12 is mounted. The sample table 13 includes a mechanism that tilts and moves the sample 12, and an observation region of the sample 12 can be determined by this mechanism. The SEM includes a vacuum exhaust facility (not shown) that vacuum-exhausts the sample chamber 11 and the SEM column 1.

Further, the SEM includes a control unit 15 that controls the entire SEM. The control unit 15 controls each component of the SEM and executes various pieces of information processing. The control unit 15 includes an image display device (not shown), and displays an SEM image generated based on information obtained from the detector on the image display device.

The control unit 15 may be implemented by using, for example, a general-purpose computer, or may be implemented as a function of a program executed on the computer. The computer includes at least a processor such as a central processing unit (CPU), a storage unit such as a memory, and a storage device such as a hard disk. The processing of the control unit 15 is stored in the memory as program codes and may be implemented by the processor executing each program code. Apart of the control unit 15 may be configured with hardware such as a dedicated circuit board.

The objective lens 4 of the SEM column 1 is an out-lens type having a small leakage magnetic field toward the sample 12. Further, the SEM column 1 includes a boosting unit as a deceleration optical system. Specifically, in the SEM column 1, a cylindrical acceleration electrode 3 is provided along an optical axis from the electron source 2, and a voltage from a boosting voltage source 14 is applied to the acceleration electrode 3. The boosting voltage source 14 is controlled by the control unit 15. In addition, a deceleration electrode 5 is provided at a distal end portion of the objective lens. The acceleration electrode 3 is set to a higher voltage than the deceleration electrode 5 by the voltage application from the boosting voltage source 14. Accordingly, a deceleration electric field for the probe electron beam is formed between a sample side end portion of the acceleration electrode 3 and the deceleration electrode 5, and the probe electron beam is decelerated due to a lens action when passing through this electric field. A voltage difference between the sample 12 and the acceleration electrode 3 is set to, for example, about 10 kV, and the stronger a leakage electric field from the SEM column 1 is, the more an electrostatic lens action having a short focal distance can be obtained in the vicinity of the sample 12. Accordingly, aberration is reduced and an effect of improving resolution is improved.

In an example of FIG. 1, the deceleration electrode 5 is made of a magnetic material, and an objective lens magnetic path and the deceleration electrode 5 function as one magnetic circuit. In contrast, the deceleration electrode 5 may be configured as an electrode independent of the objective lens 4.

In the deceleration optical system, the signal electrons emitted from the sample 12 are accelerated by an electric field from the deceleration electrode 5 and collected in the SEM column 1. A collecting effect by this electric field is efficient especially for signal electrons having low energy. The signal electrons that enter the SEM column 1 are detected by the first detector 6 provided inside the acceleration electrode 3 in the SEM column. A sensing surface of the first detector 6 has a higher voltage than that of the sample 12, for example, has the same voltage as the acceleration electrode 3. In this case, the signal electrons are accelerated more than when they are emitted from the sample 12 to reach the sensing surface of the first detector 6, and therefore signal detection efficiency of the first detector 6 can be improved. For example, when the sensing surface is formed by a semiconductor element, an amplification rate increases in proportion to energy of signal electrons, and efficient detection can be performed. Further, when a fluorescent substance such as a scintillator is used for the sensing surface, since a light emission amount is proportional to the energy of the signal electrons, the efficiency can be improved by increasing the signal electron energy.

In addition, a second detector 7 is provided between the deceleration electrode 5 and the sample 12. The second detector 7 includes an opening portion 9 through which the probe electron beam passes, and a sensing surface 8 around the opening portion 9. The sensing surface 8 of the second detector 7 is sensitive to signal electrons from the sample, and may use a semiconductor element. Further, the sensing surface 8 may include a structure including the fluorescent substance sensitive to electrons and a photodetector for detecting light emission. A photodiode, a photomultiplier tube (PMT), a silicon photomultiplier (SiPM) and the like may be used for photodetection. Further, the sensing surface 8 may include a light guide body which guides the light emission from the fluorescent substance to the photodetector.

Here, the second detector 7 has a shape in which an inner diameter r of the opening portion 9 is larger than an inner diameter R of an opening portion of the deceleration electrode 5. The opening inner diameter R of the deceleration electrode 5 and the opening inner diameter r of the second detector 7 have a great influence on an electric field formed between the column and the sample.

FIG. 2 is a schematic diagram showing a voltage distribution in the vicinity of the sample in the SEM including the deceleration optical system. An electric field formed mainly by the acceleration electrode 3 to which a boosting voltage is applied and which becomes the high voltage and the deceleration electrode 5 which is a ground voltage leaks from the opening portion of the deceleration electrode 5, and the leakage electric field spreads to the vicinity of the sample 12. In the related art, the leakage electric field is shielded by providing an under-objective-lens detector in such a deceleration optical system. Description will be made with reference to FIG. 3.

FIG. 3 is a schematic diagram showing a voltage distribution in the vicinity of the sample when an under-objective-lens detector 37 in the related art is disposed between the column and the sample. In the under-objective-lens detector 37 in the related art, an inner diameter of an opening portion for passing the probe electron beam is small so that a sensing surface 38 can be widened. Therefore, as shown in FIG. 3, the electric field is shielded by the under-objective-lens detector 37 in the related art. Therefore, the voltage distribution is closer to an electron source side than in a case where there is no detector 37 (FIG. 2). Accordingly, a main surface position of an electrostatic lens moves away from the sample 12, and the aberration of the electrostatic lens increases. At this time, an element which determines a degree to which the electric field is shielded is a portion where an inner diameter of an opening portion of a structure disposed between the column and the sample is minimized. A structure of the detector other than the opening portion having the minimum inner diameter does not affect the degree to which the electric field is shielded.

In contrast, FIG. 4 shows a voltage distribution in the vicinity of the sample when the second detector 7 of the present embodiment is disposed as the under-objective-lens detector. The minimum inner diameter r of the opening portion of the second detector 7 is equal to or larger than the opening diameter R of the deceleration electrode 5. With such a configuration, the effect of shielding the electric field by the second detector 7 is reduced, and the voltage distribution spreads to the vicinity of the sample which is similar to the case where there is no second detector 7. Therefore, an influence of the second detector 7 on the irradiation system can be minimized.

A thickness d of the opening portion of the second detector 7 also affects the electric field although its dependence is smaller than that of the opening diameter. Therefore, in addition to the opening diameter r of the second detector 7 being preferably equal to or greater than the opening diameter R of the deceleration electrode 5, it is more preferable that r≥R+d when the thickness of the opening portion having the minimum inner diameter of the second detector 7 is set to d.

Further, an effect of change in the electric field is not limited to the irradiation system. In order to implement highly efficient detection in the deceleration optical system, an in-column detector (first detector 6) is often provided. At this time, also in the signal detection, the electric field between the column and the sample, which is determined by a configuration of the opening inner diameter of the second detector 7, is greatly affected. In particular, as shown in FIG. 3, it is difficult to collect the signal electrons generated from the sample 12 in a situation where the electric field leaking to the vicinity of the sample is shielded by the under-objective-lens detector. Accordingly, a detection yield of the in-column detector is significantly reduced. In contrast, in a structure shown in FIG. 4, the electric field in the vicinity of the sample is not shielded by the under-objective-lens detector. Accordingly, a sufficient signal electron collecting effect can be obtained, and the in-column detector can bring an original detection performance.

Further, the second detector 7 includes a position moving mechanism 10. In the deceleration optical system shown in FIG. 1, the electric field between the column and the sample is determined by a relative positional relationship among the acceleration electrode 3, the deceleration electrode 5, and the opening portion 9 of the second detector 7. In the deceleration optical system using the electrostatic lens action caused by the electric field between the acceleration electrode 3 and the deceleration electrode 5, symmetry of an electric field distribution with respect to an axis, in addition to an electric field in the vicinity of the axis, has a great influence on a performance of an irradiation system and detection system.

FIG. 5 is a diagram showing a voltage distribution in the vicinity of the sample when an axis of the opening of the second detector 7 does not match an axis of the optical system. As shown in FIG. 4, when central axes of the acceleration electrode 3, the deceleration electrode 5, and the opening portion 9 of the detector do not match even when the minimum opening diameter of the second detector 7 is greater than the opening diameter of the deceleration electrode 5, the electric field distribution is non-axisymmetric. When the probe electron beam is emitted into the non-axisymmetric electric field, the irradiation system performance is adversely affected, such as a change in an irradiation position due to deflection of the probe electron beam and an increase in off-axis aberration caused by the probe electron beam passing off-axis in a lens field.

In order to eliminate this adverse effect, a position of the axis of the opening portion 9 of the second detector 7 needs to be adjusted to be along an axis of an electric field distribution determined by a positional and structural relationship between the acceleration electrode 3 and the deceleration electrode 5 in a state where no structure such as the second detector 7 is disposed between the column and the sample. With the position moving mechanism 10, the position of the second detector 7 can be adjusted to a position where the electric field is axisymmetrical, and the adverse effect caused by an arrangement of the second detector can be reduced.

FIG. 6 is a diagram showing an example of calculated values of a relationship between a shift amount of an opening position of an under-lens detector and a non-axisymmetric aberration in a typical column configuration. On a vertical axis of FIG. 6, an aberration amount (coma aberration amount) derived from non-axial symmetry of the electric field when the under-the-lens detector is axially shifted is normalized by an aberration amount originally possessed by the objective lens (axial aberration amount+ chromatic aberration amount). It can be seen from FIG. 6 that the non-axisymmetric aberration increases as the axial shift amount of the detector increases. Further, it can be seen that when there is an axis shift of about 0.1 mm or more, extra aberration exceeding the original objective lens performance will occur. That is, in this system, it is desirable that final position adjustment can be performed with an accuracy of about 0.1 mm, and it is desirable that the position moving mechanism can stably perform fine movement of 0.1 mm or less. Further, when the position moving mechanism is provided with a retractable moving mechanism, reproducibility of the position movement is preferably about 0.1 mm or less. When movement can be performed with good reproducibility, since the number of times of position adjustment to be described later can be reduced, improvement in usability can be expected.

It is desirable to adjust the position of the second detector 7 while visually recognizing an image. Therefore, it is desirable that the position moving mechanism 10 is a mechanism which can adjust the position from outside of the column 1 or the sample chamber 11 while maintaining the vacuum in the sample chamber. Further, the position moving mechanism 10 is more preferably provided with a mechanism which can cause the second detector 7 to retract to a position where the electric field caused by the deceleration electrode 5 does not reach. This is to facilitate the position adjustment for determining the detector position, which will be described later.

A procedure for adjusting the position of the second detector in the present embodiment will be described.

(1) First, in a state where the second detector 7 is not disposed, or the second detector 7 retracts to the position where the electric field from the deceleration electrode 5 does not reach, the sample 12 is scanned with the probe electron beam, the signal electrons are detected, and the SEM image (charged particle beam image) is obtained. At this time, it is desirable that the sample 12 is a structure in which determination of an image position is easy to be performed. For example, a lattice-shaped sample such as a mesh or a nanoscale is suitable. Further, a detector provided in the column such as the first detector 6 is used for the detection of the signal electrons. Another detector disposed in the sample chamber 11 may be used.

(2) Next, the second detector 7 is moved to a detection position, and an SEM image is obtained again in a state where the second detector 7 is adjusted to a position where the probe electron beam passes through the opening portion 9 of the second detector 7. The SEM image before the second detector 7 is disposed and the SEM image after the second detector 7 is disposed are compared, and the position of the second detector 7 is adjusted by the position moving mechanism 10 so as to eliminate the position shift of the sample 12.

It is desirable that the position adjustment is performed with a relatively low acceleration voltage. This is because the probe electron beam at the low acceleration voltage has a larger deflection amount when affected by asymmetry of the deceleration electric field. For example, it is desirable to perform the adjustment in an acceleration voltage region of 5 kV or less.

Further, in the adjustment procedure (2), by providing a voltage source for periodically changing the acceleration voltage of the probe electron beam, more detailed position adjustment of the second detector 7 can be performed. Specifically, the position of the second detector 7 is adjusted so as to minimize image movement when the acceleration voltage is periodically changed. Accordingly, the position of the second detector 7 can be adjusted to a position where chromatic aberration caused by the asymmetry of the electric field is minimized.

At this time, instead of the acceleration voltage of the probe electron beam, a voltage applied to the acceleration electrode 3 may be periodically changed. In this case, before the position adjustment of the second detector 7, first, an electron optical system is preferably adjusted so that the image does not move due to the periodic change of the voltage of the acceleration electrode 3 in the state where the second detector 7 is not disposed.

A method of adjusting the position of the detector based on a movement amount of the SEM image has been described. It is also possible to determine whether the appropriate adjustment is completed by comparison of an image quality such as brightness and shading of the SEM image detected by the first detector 6 in the column. A trajectory of the signal electrons generated from the sample 12 changes due to the electric field between the column and the sample. Therefore, when the detector is not adjusted to an appropriate position and the electric field distribution is changed as compared with the case where the second detector 7 is not disposed, an amount, an emission angle, and energy of the signal electrons reaching the first detector 6 are changed. Accordingly, the image quality is changed. Therefore, based on the comparison of the image quality of the SEM image detected by the first detector 6 depending on presence or absence of the second detector 7, the position of the second detector 7 can be adjusted so as to minimize a difference in the image quality. The same applies to modifications to be described below.

As described above, the second detector 7 has been described as an electron beam detector, but signal types detected by the second detector 7 may be a signal other than the electrons generated by an interaction between the probe electron beam and the sample 12. For example, when the sensing surface 8 of the second detector 7 uses a semiconductor, a characteristic X-ray generated by the interaction between the probe electron beam and the sample 12 can be detected depending on manufacturing conditions of a detection element. This characteristic X-ray reflects a composition of the sample 12, and composition analysis can be performed. Further, for example, when the second detector 7 uses the light guide body, such as a light guide and an optical fiber, and is a detector for detecting light, fluorescence generated by the interaction between the probe electron beam and the sample 12 can be detected.

Next, a first modification of the present embodiment describes a configuration including, as the objective lens 4, an objective lens of a type in which a magnetic field is positively penetrated to a sample side. Compared with the out-lens type, a semi-in-lens type objective lens is formed at a position at which a main surface position of the magnetic field lens is closer to the sample. Therefore, when combining with a boosting unit, the main surface of the electrostatic lens due to the deceleration electric field also needs to be formed at a position closer to the sample. From this request, the electric field in the vicinity of the sample tends to be stronger than in the case of the out-lens type. Therefore, an influence of the under-objective-lens detector is more likely to be manifested. FIG. 7 shows a modification using a semi-in-lens type objective lens as an objective lens. In this example, the deceleration electrode 5 is provided as a disk-shaped electrode including an opening for transmitting the probe electron beam directly under the objective lens 4, and a diameter of the opening portion 9 of the second detector 7 is greater than an opening diameter of the deceleration electrode 5. In this way, even when combined with the semi-in-lens type objective lens, by appropriately adjusting the position of the second detector 7 using the position moving mechanism 10, an adverse effect due to a change in a deceleration electric field due to the arrangement position of the second detector 7 can be reduced and a device performance can maximized.

Further, as a second modification of the present embodiment, FIG. 8 shows a configuration including a voltage source 16 that applies a voltage to the second detector 7. It is conceivable that some advantages can be obtained by applying the voltage to the second detector 7 by the detector voltage source 16. For example, when a semiconductor element is used as the sensing surface of the second detector 7, by applying a bias voltage of about several to several tens of V, improved element performance may be expected such as an increase in gain and a decrease in parasitic capacitance. Alternatively, a case may be considered where energy of the signal electrons detected by the second detector 7 is controlled within a predetermined range by applying a predetermined voltage to the second detector 7.

Due to such a request, even in a configuration in which the voltage is applied to the second detector 7, by setting the inner diameter of the opening portion 9 of the second detector 7 greater than the opening diameter of the deceleration electrode 5 and performing the position adjustment of the second detector 7 by the position moving mechanism 10, an adverse effect due to a change in a deceleration electric field due to the arrangement position of the second detector 7 can be reduced and a device performance can maximized.

The position adjustment can be performed in a similar manner as described above, but the adjustment procedure (2) may be performed based on the image movement or the change in the image quality when the second detector voltage applied by the detector voltage source 16 is changed. Specifically, the position of the second detector 7 is adjusted by the position moving mechanism 10 to a position where the image movement or the change in the image quality when the second detector voltage is periodically changed is minimized.

Further, as a third modification of the present embodiment, a configuration of an SEM further including a retarding unit will be described. There is no main difference between a boosting optical system and a retarding optical system in a deceleration electric field due to a voltage difference between a SEM column and a sample. In the retarding optical system, since a voltage of the sample is directly changed, an electric field in the vicinity of the sample becomes stronger. Therefore, an influence of an under-objective-lens detector is more likely to be manifested when the retarding unit is provided in addition to a boosting unit.

FIG. 9 shows the modification including the retarding unit, in which a retarding voltage source 17 that applies a retarding voltage to the sample table 13 is provided. The retarding voltage has a polarity opposite to that of a boosting voltage. Control of the retarding voltage source 17 is performed by the control unit 15. By setting an inner diameter of the opening portion 9 of the second detector 7 greater than an opening diameter of the deceleration electrode 5 and performing position adjustment of the second detector 7 by the position moving mechanism 10, an adverse effect due to a change in a deceleration electric field (the deceleration electric field is determined by the acceleration electrode 3, the deceleration electrode 5, and the sample 12) due to an arrangement position of the second detector 7 can be reduced and a device performance can maximized.

The position adjustment can be performed in a similar manner as described above, but the adjustment procedure (2) may be performed based on the image movement or a change in an image quality when the retarding voltage applied by the retarding voltage source 17 to the sample 12 is changed. Specifically, the position of the second detector 7 is adjusted by the position moving mechanism 10 to a position where the image movement or the change in the image quality when the retarding voltage is periodically changed is minimized.

FIG. 10 shows a modification in which the second detector 7 between a column and a sample is formed by a plurality of detectors. Even when the plurality of detectors are provided, a minimum opening diameter of each detector may be greater than a diameter of a deceleration electrode.

Further, an opening of each detector need not be a perfect hole shape. In this case, the minimum opening diameter of the detector is defined as a distance at which an optical axis through which a probe electron beam passes and a structure including a sensing surface are brought closer to each other again.

Further, it is desirable that each of the plurality of detectors between the column and the sample is provided with the position moving mechanism 10, but it is not always necessary that all the detectors can be adjusted in position independently, and if some of the detectors include a moving mechanism, position adjustment can be performed so that an optimum electric field is obtained. The plurality of detectors may be obtained by dividing one detector, or may be configured as independent detectors. The plurality of detectors may detect the same type of signal or may detect different types of signals. Further, detection principles of the detectors may be different from each other.

The invention is not limited to the above embodiment and includes various modifications. The present embodiment described above has been described in detail for easy understanding of the invention, and is not necessarily limited to those including all the configurations described above. Apart of a configuration of one embodiment may be replaced with a configuration of another embodiment. The configuration of another embodiment can be added to the configuration of one embodiment. In addition, other configurations can be added to, deleted from, or replaced with a part of the configuration of each embodiment.

Further, although the SEM is described as an example of the charged particle beam device, the invention can be applied to other charged particle beam devices and to a composite charged particle beam device in which a plurality of charged particle beam devices are combined.

REFERENCE SIGN LIST

1 SEM column
2 electron source
3 acceleration electrode
4 objective lens
5 deceleration electrode
6 first detector
7 second detector
8 sensing surface
9 opening portion
10 position moving mechanism
11 sample chamber
12 sample
13 sample table
14 boosting voltage source
15 control unit
16 detector voltage source
17 retarding voltage source

The invention claimed is:

1. A charged particle beam device comprising:
an electron source;
an objective lens configured to focus a probe electron beam from the electron source on a sample;
an acceleration electrode configured to accelerate the probe electron beam;
a first detector provided in the acceleration electrode;
a deceleration electrode configured to form a deceleration electric field for the probe electron beam with the acceleration electrode, the probe electron beam being configured to pass through an opening of the deceleration electrode; and
a second detector inserted between the deceleration electrode and the sample, wherein
the second detector includes an opening portion larger than the opening of the deceleration electrode, and a sensing surface is provided around the opening portion.

2. The charged particle beam device according to claim 1, wherein
a minimum inner diameter of the second detector is equal to or greater than a sum of an opening diameter of the deceleration electrode and a thickness of the opening portion having the minimum inner diameter of the second detector.

3. The charged particle beam device according to claim 1, further comprising:
a position moving mechanism configured to move the second detector.

4. The charged particle beam device according to claim 1, further comprising:
a voltage source configured to apply a voltage to the second detector.

5. The charged particle beam device according to claim 1, further comprising:
a voltage source configured to apply a voltage having a polarity opposite to a voltage applied to the acceleration electrode to the sample.

6. The charged particle beam device according to claim 1, wherein
the second detector includes a plurality of detectors.

7. The charged particle beam device according to claim 6, further comprising:
a plurality of position moving mechanisms, wherein each of the plurality of position moving mechanisms moves a position of any one of the plurality of detectors constituting the second detector.

8. A method for adjusting a position of a detector of a charged particle beam device, the method comprising:
scanning a sample with a probe electron beam to obtain a first charged particle beam image in a state in which the detector is retracted, by a position moving mechanism, from under an objective lens that forms a magnetic field lens;
scanning the sample with the probe electron beam to obtain a second charged particle beam image in a state in which the detector is disposed under the objective lens by the position moving mechanism; and
moving the position of the detector by the position moving mechanism based on a position shift of the sample or a change in an image quality between the first charged particle beam image and the second charged particle beam image.

9. The method for adjusting the position of the detector according to claim 8, wherein
the probe electron beam has an acceleration voltage of 5 kV or less.

10. The method for adjusting the position of the detector according to claim 8, wherein
the first charged particle beam image and the second charged particle beam image are obtained from signal electrons detected by the detector.

11. The method for adjusting the position of the detector according to claim 8, wherein
the position of the detector is moved by the position moving mechanism so as to minimize a movement of an image or the change in the image quality when an acceleration voltage of the probe electron beam is periodically changed.

12. The method for adjusting the position of the detector according to claim 8, wherein
the charged particle beam device includes an acceleration electrode that accelerates the probe electron beam, and
the position of the detector is moved by the position moving mechanism so as to minimize a movement of an image or the change in the image quality when a voltage applied to the acceleration electrode is periodically changed.

13. The method for adjusting the position of the detector according to claim 8, wherein
a voltage source that applies a voltage to the detector is provided, and
the position of the detector is moved by the position moving mechanism so as to minimize a movement of an image or the change in the image quality when the voltage applied to the detector is periodically changed.

14. The method for adjusting the position of the detector according to claim 8, wherein
the charged particle beam device includes an acceleration electrode that accelerates the probe electron beam,
a voltage source configured to apply a voltage having a polarity opposite to a voltage applied to the acceleration electrode to the sample is provided, and
the position of the detector is moved by the position moving mechanism so as to minimize a movement of an image or the change in the image quality when the voltage applied to the sample is periodically changed.

* * * * *